(12) United States Patent
Jung

(10) Patent No.: US 12,295,224 B2
(45) Date of Patent: May 6, 2025

(54) ORGANIC LIGHT-EMITTING DISPLAY DEVICE HAVING IMPROVED APERTURE RATIO STRUCTURE AND METHOD FOR MANUFACTURING THE SAME

(71) Applicant: LG Display Co., Ltd., Seoul (KR)

(72) Inventor: Kiyoung Jung, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 826 days.

(21) Appl. No.: 17/459,560

(22) Filed: Aug. 27, 2021

(65) Prior Publication Data

US 2022/0069059 A1 Mar. 3, 2022

(30) Foreign Application Priority Data

Sep. 1, 2020 (KR) .................. 10-2020-0110969

(51) Int. Cl.
*H10K 59/131* (2023.01)
*H10K 50/84* (2023.01)
*H10K 50/86* (2023.01)
*H10K 71/00* (2023.01)
*H10K 59/12* (2023.01)

(52) U.S. Cl.
CPC .......... *H10K 59/131* (2023.02); *H10K 50/84* (2023.02); *H10K 50/865* (2023.02); *H10K 71/00* (2023.02); *H10K 59/1201* (2023.02)

(58) Field of Classification Search
CPC ..... H10K 59/131; H10K 50/84; H10K 50/865

USPC ........................................... 257/40
See application file for complete search history.

(56) References Cited

U.S. PATENT DOCUMENTS

| 10,861,927 | B2* | 12/2020 | Park | H10K 59/88 |
| 2016/0043341 | A1* | 2/2016 | Heo | H10K 59/122 |
| | | | | 438/23 |
| 2018/0175077 | A1* | 6/2018 | Koo | H10K 59/126 |

FOREIGN PATENT DOCUMENTS

KR 10-2019-0122048 A 10/2019

* cited by examiner

*Primary Examiner* — Xia L Cross
(74) *Attorney, Agent, or Firm* — Birch, Stewart, Kolasch & Birch, LLP

(57) ABSTRACT

Discussed is a display device capable of reducing a number of contact holes and thus improving a aperture ratio, in a structure in which a power line is branched so that power is supplied by the branch line to a thin-film transistor. Further, a method for manufacturing the same is discussed. To this end, in the branch line, a contact-hole is not formed adjacent to the driving thin-film transistor, while a contact-hole is formed only adjacent to the power line VDD/Ref. A dual line of the branch line composed of an active layer and a molybdenum-titanium layer extends from the contact-hole to the driving thin-film transistor, so that the power is supplied to the driving thin-film transistor through the molybdenum-titanium layer MoTi.

12 Claims, 11 Drawing Sheets

(a)

(b)

(c)

(a)

(b)

(c)

TGAT D/E (a)

(b)

(c)

FIG. 5
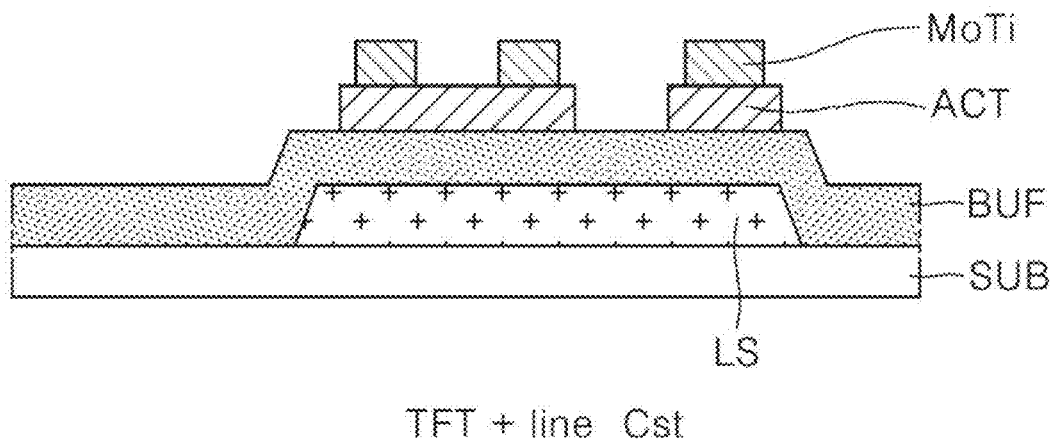
TFT + line Cst
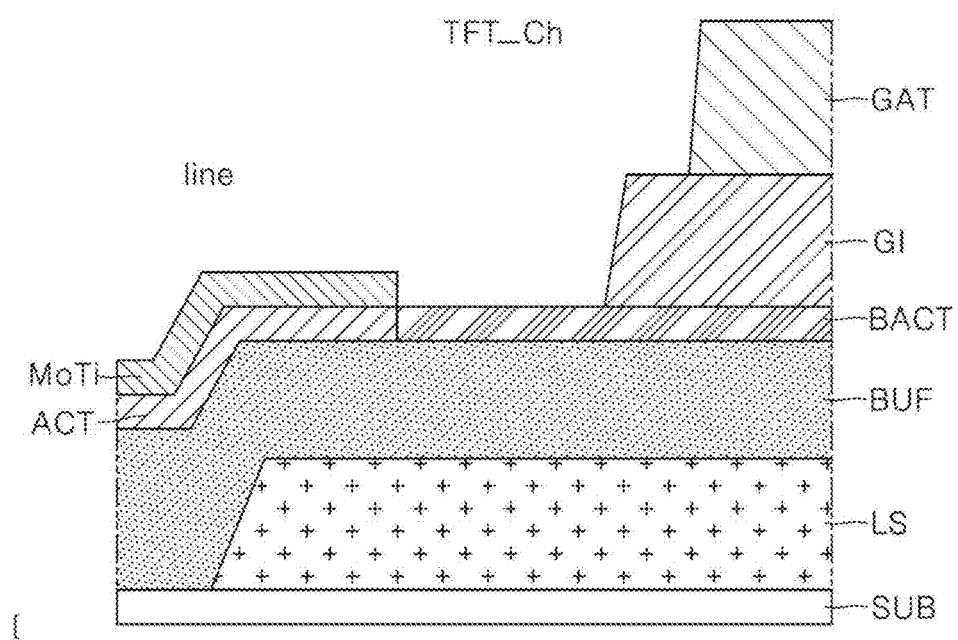
FIG. 6

4.1 μm × 4.1 μm

FIG. 15
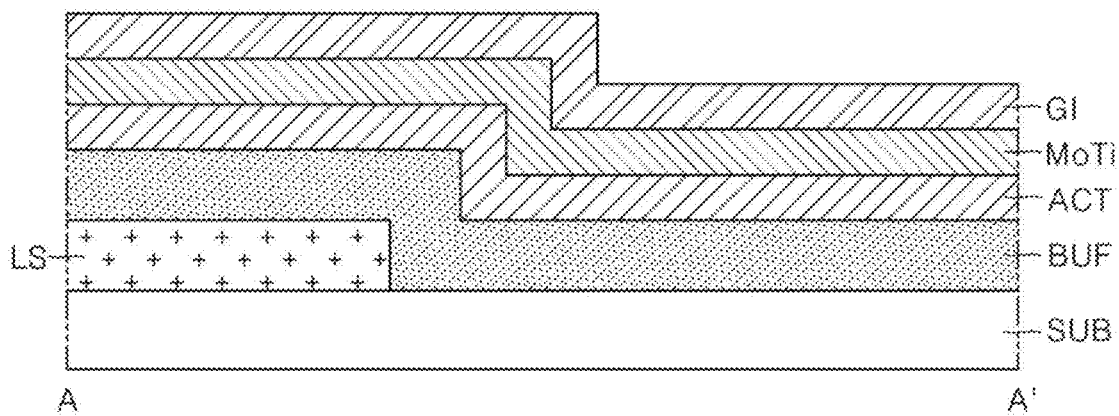
FIG. 16
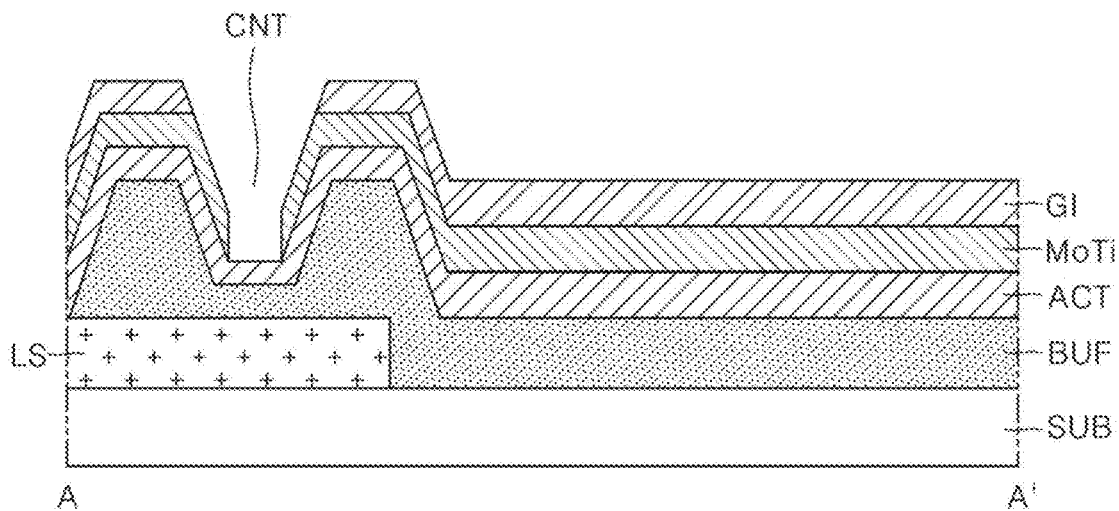
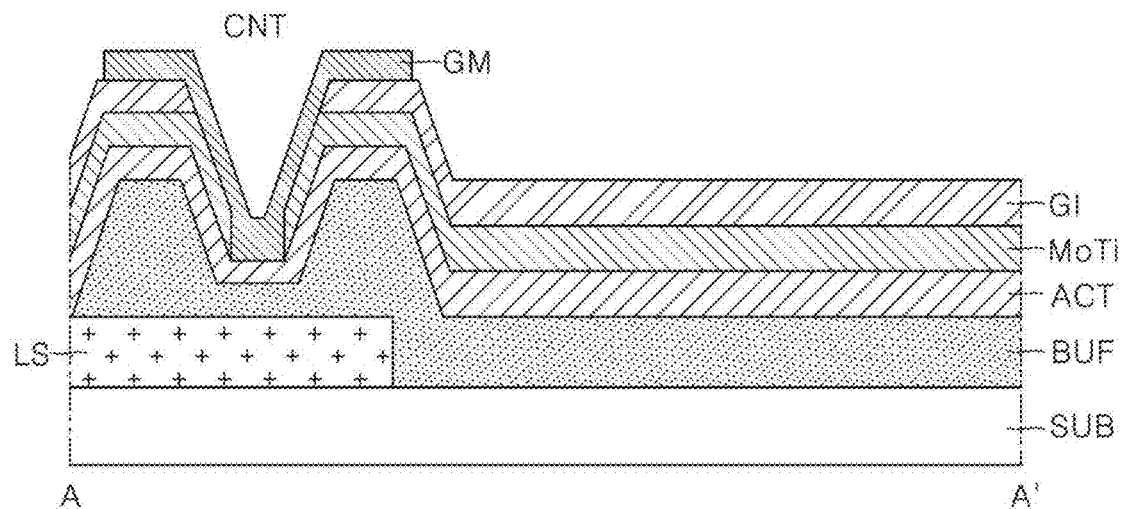
FIG. 17

ORGANIC LIGHT-EMITTING DISPLAY DEVICE HAVING IMPROVED APERTURE RATIO STRUCTURE AND METHOD FOR MANUFACTURING THE SAME

CROSS-REFERENCE TO RELATED APPLICATION

This application claims a priority benefit under 35 U.S.C. § 119(a) to Korean Patent Application No. 10-2020-0110969 filed on Sep. 1, 2020, in the Korean Intellectual Property Office, the entire contents of which are hereby incorporated herein by reference for all purposes into the present application.

BACKGROUND

Field

The present disclosure relates to an organic light-emitting display device, and a method for manufacturing the same, in which in a structure that a branch line extends from a power line VDD and supplies power to a thin-film transistor TFT, the number of contact-holes is reduced, thereby improving an aperture ratio of the device.

Description of Related Art

An organic light-emitting diode (OLED) included in an OLED display device has high luminance and low operating voltage characteristics, and is self-luminous. Thus, the OLED display device has higher contrast ratio and is easily implemented as an ultra-thin display. Further, a response time thereof is several microseconds μs, and thus a moving image is easily rendered. The device has no limitation to a viewing angle, and is stable at low temperatures.

In this OLED display device, one pixel P has a structure including three thin-film transistors Tsw, Tdr, and Tss and one capacitor C1. The pixel includes an organic light-emitting diode EL, a driving thin-film transistor Tdr that supplies current to the organic light-emitting diode EL, a scan thin-film transistor Tsw receiving a data voltage Vdata, and disposed between the driving thin-film transistor Tdr, and a line for supplying the data voltage for supplying the data voltage Vdata to a gate of the driving thin-film transistor Tdr according to a scan signal Vscan, a sensing thin-film transistor Tss connected between and coupled to a sensing controller and the driving thin-film transistor Tdr to sink a current resulting from the driving thin-film transistor Tdr according to a sensing signal Vsense, and a capacitor C1 connected to and disposed between the gate and the source of and the driving thin-film transistor Tdr.

In order to realize a high-resolution image that requires high-definition higher than Full-HD in the OLED display device, each pixel needs to be configured to have a high aperture ratio structure.

SUMMARY OF THE INVENTION

In a mass production structure of OLED display devices, current and voltage are supplied to the driving thin-film transistor Tdr using a gate metal layer branching from a power line VDD and a reference line Ref.

In order to supply the current and voltage to the driving thin-film transistor Tdr, it is necessary to jump the current and voltage to an active layer ACT thereof. Thus, the number of contact holes can be increased by 1 per pixel. Thus, considering power lines VDD and reference lines Ref for 4 pixels, 8 contact-holes need to be formed.

Therefore, the increase in the number of the contact-holes can act as a main cause of decrease in an aperture ratio.

Accordingly, in order to address the above-described limitation and other issues, the inventors of the present disclosure have invented a display device capable of reducing the number of the contact holes and thus improving the aperture ratio in a structure in which the power line VDD/Ref is branched in the organic light-emitting (OLED) display device and the power is supplied through the branched line to the thin-film transistor Tdr, and further have invented a method for manufacturing the same.

Further, to this end, the inventors of the present disclosure have invented an organic light-emitting display device in which in a branch line BL that connects the power line VDD/Ref and the driving thin-film transistor Tdr to each other, a contact-hole CNT is not formed adjacent to the driving thin-film transistor Tdr, while a contact-hole CNT is formed only adjacent to the power line VDD/Ref, and a dual line composed of an active layer ACT and a molybdenum-titanium layer MoTi extends from the contact-hole CNT to the driving thin-film transistor Tdr, such that the power is supplied to the driving thin-film transistor Tdr through the molybdenum-titanium layer MoTi.

Further, the inventors of the present disclosure have invented a manufacturing method of an organic light-emitting display device in which a gate metal layer GM does not extend from the power line VDD/Ref to the driving thin-film transistor Tdr, and the power line VDD/Ref and the driving thin-film transistor Tdr are connected to each other through a branch line BL, and the branch line BL is made of a dual layer of the active layer ACT and the molybdenum-titanium layer MoTi, and one contact-hole CNT is formed only adjacent to the power line VDD/Ref, and the gate metal layer GM connected to the power line VDD/Ref contacts the molybdenum-titanium layer MoTi in the contact-hole area CNT, such that the power from the power line VDD/Ref is supplied to a channel of the driving thin-film transistor Tdr through the molybdenum-titanium layer MoTi in contact with the gate metal layer GM in the contact-hole area CNT.

Purposes according to the present disclosure are not limited to the above-mentioned purpose. Other purposes and advantages according to the present disclosure that are not mentioned can be understood based on following descriptions, and can be more clearly understood based on embodiments according to the present disclosure. Further, it will be easily understood that the purposes and advantages according to the present disclosure can be realized using means shown in the claims and combinations thereof.

In an organic light-emitting OLED display device according to an embodiment of the present disclosure, a branch line BL connecting the power line VDD/Ref for applying power to the driving thin-film transistor to the driving thin-film transistor Tdr can include a stack of a light-blocking layer LS, a buffer layer BUF, an active layer ACT, a molybdenum-titanium layer MoTi, and a gate insulating layer GI. In the branch line, a contact-hole CNT is formed only adjacent to the power line VDD/Ref, and the contact-hole is not formed adjacent to the driving thin-film transistor Tdr. In the contact-hole area CNT, the gate metal layer GM is formed on the gate insulating layer GI. While the gate metal layer GM and the molybdenum-titanium layer MoTi are in contact with each other, a dual line composed of the active layer ACT and the molybdenum-titanium layer MoTi can extend from the contact-hole CNT to the driving thin-film transistor Tdr. Thus, the power from the power line VDD/Ref can be supplied from the contact-hole CNT to a metalized portion (channel) of the driving thin-film transistor Tdr through the molybdenum-titanium layer MoTi.

Further, a manufacturing method of an organic light-emitting display device according to an embodiment of the present disclosure can be provided. The OLED display device manufacturing method includes forming a branch line BL connecting the power line VDD/Ref to the driving thin-film transistor Tdr. The formation of the branch line BL includes a process of forming a light-blocking layer LS on a substrate; a process of forming a buffer layer BUF on the light-blocking layer; a process of forming a dual layer composed of an active layer ACT and a molybdenum-titanium layer MoTi on the buffer layer; a process of forming the gate insulating layer GI on the molybdenum-titanium layer; a process of forming a contact-hole CNT only in an area overlapping with the light-blocking layer LS; a process of forming the gate metal layer GI on a top face of the active layer, the molybdenum-titanium layer and the gate insulating layer in the contact-hole area CNT, wherein the molybdenum-titanium layer MoTi and the gate metal layer GM are in contact with each other in the contact-hole area CNT, and the dual line composed of the active layer ACT and the molybdenum-titanium layer MoTi extends to the channel of driving thin-film transistor Tdr. Thus, the power from the power line VDD/Ref can be supplied to the metalized portion (channel) of the driving thin-film transistor Tdr through the molybdenum-titanium layer MoTi in contact with the gate metal layer GM in the contact-hole area CNT.

According to the OLED display device and the OLED display device manufacturing method according to an embodiment of the present disclosure, the contact-hole CNT is formed only adjacent to the power line VDD/Ref, while the contact-hole is not formed adjacent to the driving thin-film transistor Tdr, such that the number of contact-holes per pixel can be reduced.

Thus, according to an embodiment of the present disclosure, the organic light-emitting (OLED) display device can reduce the number of the contact holes and thus improving the aperture ratio, in a structure in which the power line VDD/Ref is branched and the power is supplied through the branched line to the thin-film transistor Tdr.

Further, according to an embodiment of the present disclosure, the active layer ACT and the molybdenum-titanium layer MoTi as the dual line can extend from the contact-hole CNT to the driving thin-film transistor Tdr. Thus, the gate metal layer GM to supply power from the power line VDD/Ref to the driving thin-film transistor Tdr may not extend from the power line VDD/Ref to the driving thin-film transistor Tdr.

Therefore, according to the present disclosure, the gate metal layer GM may not extend from the power line VDD/Ref to the driving thin-film transistor Tdr. Thus, an amount of a material of the gate metal layer GM can be reduced in the manufacturing process of the power supply line.

Effects of the present disclosure are not limited to the above-mentioned effects, and other effects as not mentioned will be clearly understood by those skilled in the art from following descriptions.

BRIEF DESCRIPTION OF DRAWINGS

The present disclosure will become more fully understood from the detailed description given hereinbelow and the accompanying drawings which are given by way of illustration only, and thus are not limitative of the present disclosure.

FIG. 5 is a diagram showing a cross-sectional structure of a portion of a branch line connected to a driving thin-film transistor according to an embodiment of the present disclosure.

FIG. 6 is a diagram showing a structure of a portion of a branch line connected to a driving thin-film transistor according to an embodiment of the present disclosure.

FIGS. 12 to 17 are cross-sectional views sequentially showing the manufacturing process of the branch line according to an embodiment of the present disclosure.

DETAILED DESCRIPTION OF THE EMBODIMENTS

Figure 1:
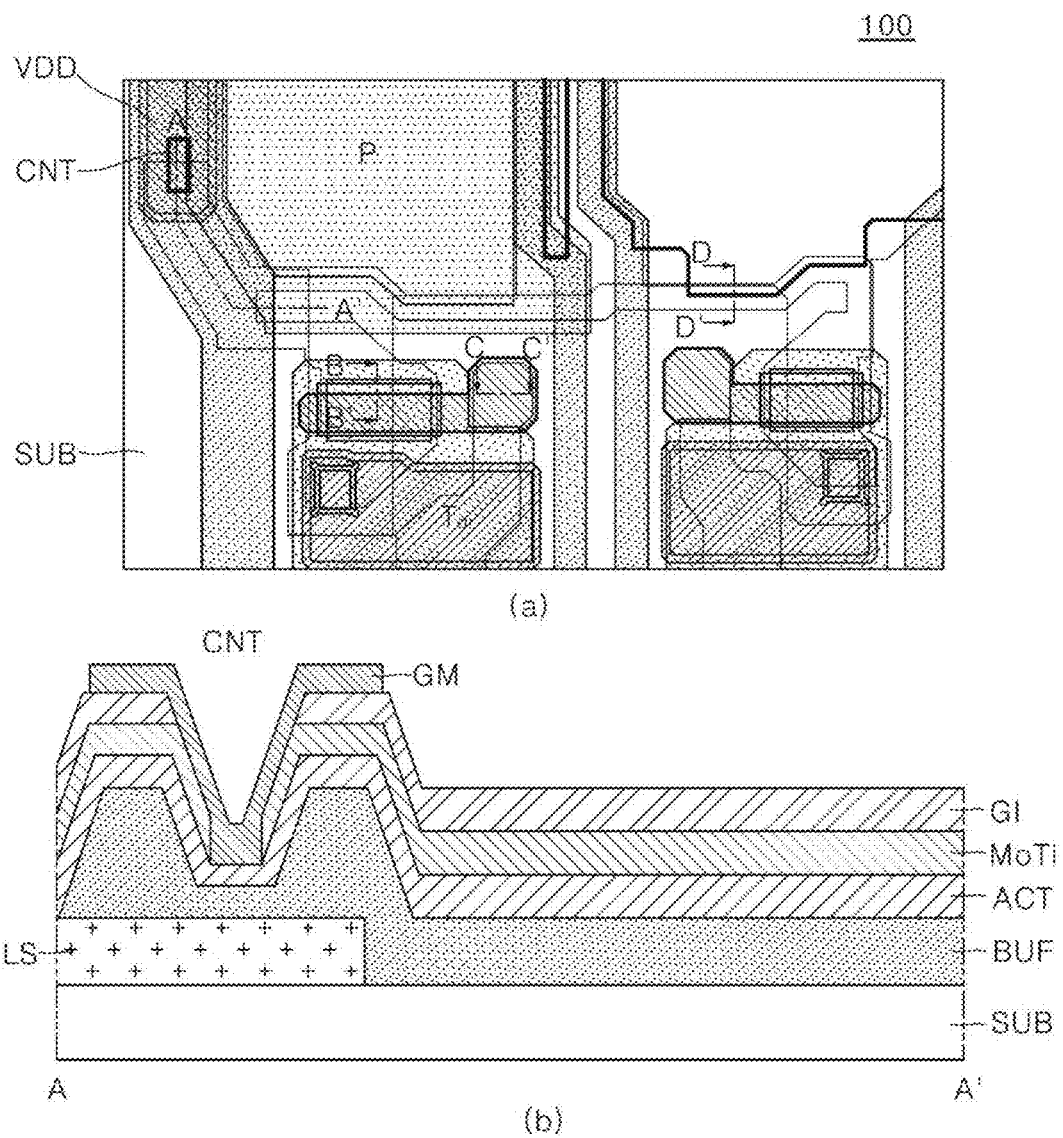
FIG. 1 is a schematic diagram showing a planar configuration (a) and a cross section (b) of a branch line of an organic light-emitting display device according to an embodiment of the present disclosure.

Advantages and features of the present disclosure, and a method of achieving the Advantages and features will become apparent with reference to embodiments described later in detail together with the accompanying drawings. However, the present disclosure is not limited to the embodiments as disclosed below, but can be implemented in various different forms. Thus, these embodiments are set forth only to make the present disclosure complete, and to completely inform the scope of the disclosure to those of ordinary skill in the technical field to which the present disclosure belongs, and the present disclosure is only defined by the scope of the claims.

A shape, a size, a ratio, an angle, a number, etc. disclosed in the drawings for describing the embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure can be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements can modify the entire list of elements and may not modify the individual elements of the list. In interpretation of numerical values, an error or tolerance therein can occur even when there is no explicit description thereof.

In addition, it will also be understood that when a first element or layer is referred to as being present "on" a second element or layer, the first element can be disposed directly on the second element or can be disposed indirectly on the second element with a third element or layer being disposed between the first and second elements or layers. It will be understood that when an element or layer is referred to as being "connected to", or "coupled to" another element or layer, it can be directly on, connected to, or coupled to the other element or layer, or one or more intervening elements or layers can be present. In addition, it will also be understood that when an element or layer is referred to as being "between" two elements or layers, it can be the only element or layer between the two elements or layers, or one or more intervening elements or layers can also be present.

Further, as used herein, when a layer, film, region, plate, or the like is disposed "on" or "on a top" of another layer, film, region, plate, or the like, the former can directly contact the latter or still another layer, film, region, plate, or the like can be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former can directly contact the latter or still another layer, film, region, plate, or the like can be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event can occur therebetween unless "directly after", "directly subsequent" or "directly before" is not indicated.

It will be understood that, although the terms "first", "second", "third", and so on can be used herein to describe various elements, components, regions, layers and/or sections, these elements, components, regions, layers and/or sections should not be limited by these terms. These terms are used to distinguish one element, component, region, layer or section from another element, component, region, layer or section, and may not define order. Thus, a first element, component, region, layer or section described below could be termed a second element, component, region, layer or section, without departing from the spirit and scope of the present disclosure.

The features of the various embodiments of the present disclosure can be partially or entirely combined with each other, and can be technically associated with each other or operate with each other. The embodiments can be implemented independently of each other and can be implemented together in an association relationship.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, an organic light-emitting display device according to one or more embodiments of the present disclosure and a method for manufacturing the same will be described. All components of each organic light-emitting display device according to all embodiments of the present disclosure are operatively coupled and configured.

FIG. 1 is a schematic diagram showing a planar configuration (see (a)) and a cross section (see (b)) of a branch line of an organic light-emitting display device according to an embodiment of the present disclosure and.

Referring to FIG. 1, an organic light-emitting display device 100 according to an embodiment of the present disclosure includes a driving thin-film transistor Tdr including a source, a drain, a gate electrode and a channel; a power line VDD for applying power to the driving thin-film transistor; and a branch line BL connecting the power line and the driving thin-film transistor to each other.

In this connection, the power line is exemplified as VDD for applying a power voltage VDD, but is not limited thereto. The power line can be embodied as a reference line Ref for applying a reference voltage VRef.

According to a cross-sectional view taken along a line A-A' in (a) of FIG. 1, the branch line BL includes a light-blocking layer LS on a substrate SUB, a buffer layer BUF on the light-blocking layer, an active layer ACT on the buffer layer, a first metal layer on the active layer, and a gate insulating layer GI on the first metal layer as shown in (b) of FIG. 1. In this connection, the first metal layer refers to a layer containing a metal of a conductive material, for example, molybdenum-titanium (MoTi) as an alloy of molybdenum (Mo) and titanium (Ti). Hereinafter, an example in which the first metal layer is embodied as the molybdenum-titanium layer MoTi will be described.

The light-blocking layer LS can be formed on a top face of the substrate SUB while exposing a portion of the substrate. The light-blocking layer LS on the substrate SUB can be made of a metal material having a light-blocking function in order to block inflow of external light. The light-blocking layer LS can be composed of a single layer or a multilayer structure made of one of metals such as molybdenum (Mo), aluminum (Al), chromium (Cr), tungsten (W), titanium (Ti), nickel (Ni), neodymium (Nd) and copper (Cu), or an alloy thereof.

The buffer layer BF can be formed on a top face of the exposed portion of the substrate and a top face of the light-blocking layer. The buffer layer BUF covering the light-blocking layer LS on the substrate SUB is formed to have a single insulating layer or a structure in which or a plurality of insulating layers are stacked to block foreign materials including moisture, oxygen, etc. flowing from the substrate SUB. The buffer layer BUF can be made of an inorganic insulating material such as silicon oxide $SiO_x$, silicon nitride $SiN_x$, aluminum oxide $AlO_x$, etc. and can be composed of a single layer or multilayer structure.

The active layer ACT can be formed on a top face of the buffer layer BUF. The active layer ACT can be made of an oxide semiconductor based on IZO (indium zinc oxide) or IGZO (indium gallium zinc oxide).

The molybdenum-titanium layer MoTi can be formed on a top face of the active layer. The molybdenum-titanium MoTi can refer to an alloy of molybdenum (Mo) and titanium (Ti). The active layer and the molybdenum-titanium layer can be formed using a dual deposition scheme. The active layer and the molybdenum-titanium layer can be formed by one mask process using a halftone exposure mask or a diffraction exposure mask.

The gate insulating layer GI can be formed on a top face of the molybdenum-titanium layer. The gate insulating layer GI can be made of an oxide-based insulating material to prevent a change in properties of the active layer ACT made of an oxide semiconductor.

A contact-hole CNT can be formed in the molybdenum-titanium layer and the gate insulating layer in an area overlapping with the light-blocking layer.

Lower both side walls, and a bottom of the gate metal layer GM are in contact with the molybdenum-titanium layer in the contact-hole CNT. The gate metal layer GM can be formed above the active layer ACT, on a side face of the molybdenum-titanium layer, and on a side face and a top face of the gate insulating layer GI. In this connection, the gate metal layer GM can be referred to as Gate or GAT.

As described above, in the branch line BL according to the present disclosure, the contact-hole CNT is formed only at a position adjacent to the power line VDD/Ref, and the contact-hole CNT is not formed at a position adjacent to the driving thin-film transistor Tdr.

Further, the branch line BL has the gate metal layer GM on the gate insulating layer GI in the contact-hole CNT. While the gate metal layer GM and the molybdenum-titanium layer MoTi are in contact with each other in the contact-hole CNT, the active layer ACT and molybdenum-titanium layer MoTi of the branch line BL can extend from the contact-hole CNT to the driving thin-film transistor Tdr. Thus, a dual line composed of the active layer ACT and molybdenum-titanium layer MoTi of the branch line can extend to the driving thin-film transistor Tdr.

Therefore, power from the power line VDD/Ref can be supplied from the contact-hole CNT through the molybdenum-titanium layer MoTi to a metalized portion (channel) of the driving thin-film transistor Tdr.

The organic light-emitting display device can include a display panel having a display area AA that displays an image and a non-display area NA disposed on both sides of the display area AA that supplies a signal to the display area AA.

In the display area AA, a plurality of data lines and a plurality of gate lines can be arranged to intersect with each other. A pixel P can be disposed at each of intersections therebetween.

In the display panel, a plurality of gate lines GL and a plurality of data lines DL can be disposed on an organic or plastic substrate, and cross each other. Red R, green G, and blue B pixel Ps are respectively disposed at intersections between the gate lines GL and the data lines DL.

Further, the power line VDD extending in a direction parallel to the data line DL can be formed on the display panel and can be connected to each of the pixels P.

Further, Each of the pixels P can include at least one organic light-emitting diode, a capacitor, a switching thin-film transistor and a driving thin-film transistor Tdr. In this connection, the organic light-emitting diode can include a first electrode (hole injection electrode), an organic compound layer, and a second electrode (electron injection electrode).

The organic compound layer can further include various organic layers for efficiently transmitting hole or electron carriers to the light-emissive layer, in addition to the light-emissive layer that emits light. The various organic layers can include a hole injection layer and a hole transport layer positioned between the first electrode and the light-emissive layer, and an electron injection layer and an electron transport layer positioned between the second electrode and the light-emissive layer.

Further, the driving thin-film transistor Tdr and the switching thin-film transistors can be connected to the gate line GL and a control signal supply line CL and the data line DL. The switching thin-film transistors are turned on according to a gate voltage input to the gate line GL. At the same time, a data voltage input to the data line DL is transmitted to the driving thin-film transistor Tdr. The capacitor is connected and disposed between the thin-film transistor and the power line, and is charged with the data voltage transmitted from the thin-film transistor and is maintained for one frame.

Moreover, the driving thin-film transistor Tdr is connected to the power supply line VL and the capacitor, and supplies a drain current corresponding to a voltage between the gate and the source to the organic light-emitting diode. Accordingly, the organic light-emitting diode emits light using the drain current. In this connection, the driving thin-film transistor Tdr includes a gate electrode, a source electrode and a drain electrode. An anode of the organic light-emitting diode is connected to one electrode of the driving thin-film transistor Tdr.

Figure 2:
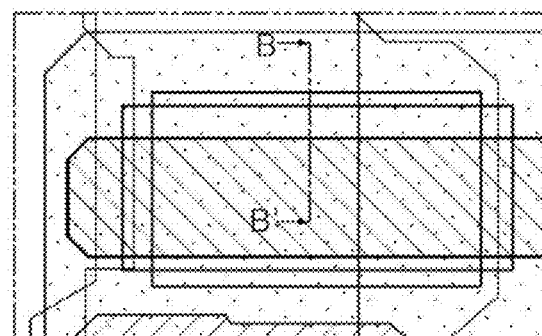
FIG. 2 is a diagram showing a structure and a cross-sectional view of a metalized portion B-B' adjacent to a driving thin-film transistor in an organic light-emitting display device according to an embodiment of the present disclosure.
Figure 2:
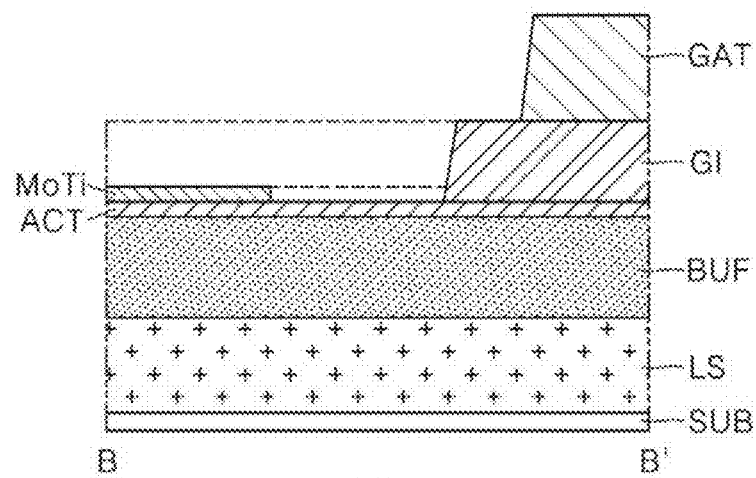
Figure 2:
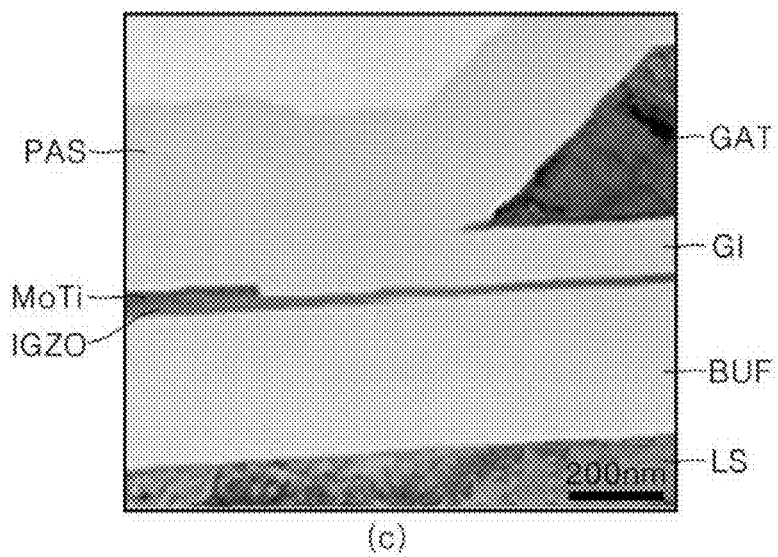

FIG. 2 is a diagram showing a structure and a cross-sectional view of a metalized portion B-B' adjacent to the driving thin-film transistor in the organic light-emitting display device according to an embodiment of the present disclosure. Particularly, (a) of FIG. 2 shows an enlarged view of an area including the B-B' portion of FIG. 1, while (b) and (c) of FIG. 2 show a cross-sectional view of the B-B' portion.

Referring to FIG. 2 including (a)-(c), in the organic light-emitting display device 100 according to the present disclosure, the dual line composed of the active layer ACT and the molybdenum-titanium layer MoTi of the branch line BL can extend from the contact-hole CNT to the driving thin-film transistor Tdr.

In this connection, the active layer ACT of the branch line BL is a non-conductor, and the molybdenum-titanium layer MoTi is a conductor.

The driving thin-film transistor Tdr is embodied as a thin-film transistor TGAT having a top gate electrode, and includes a metalized active layer. In other words, in the driving thin-film transistor Tdr, the buffer layer BUF is disposed on the light-blocking layer LS, the metalized active layer ACT is disposed on the buffer layer, the gate insulating layer GI is disposed on the active layer, and the gate electrode GE is disposed on the gate insulating layer. A cross-sectional structure of the driving thin-film transistor Tdr will be described together with the cross-sectional structure of the branch line with reference to FIG. 10.

The active layer ACT of the branch line BL extends from the contact-hole CNT and leads to the metalized active layer of the driving thin-film transistor Tdr.

The molybdenum-titanium layer MoTi of the branch line BL extends from the contact-hole CNT to the driving thin-film transistor Tdr, but does not contact the driving thin-film transistor Tdr, and is spaced from the driving thin-film transistor Tdr by a predefined spacing.

In this connection, the molybdenum-titanium layer MoTi of the branch line BL can partially contact the metalized active layer ACT of the driving thin-film transistor Tdr. Thus, the power delivered through the gate metal layer GM of the contact-hole CNT is transferred to the metalized active layer ACT of the driving thin-film transistor Tdr through the molybdenum-titanium layer MoTi.

The metalized active layer ACT of the driving thin-film transistor Tdr is formed using a halftone ashing (H/T ashing) and then a wet etching process using OZ acid, and contacts the drain electrode D/E.

Therefore, the power of the power line VDD/Ref is transferred from the contact-hole CNT through the molybdenum-titanium layer MoTi in contact with the gate metal layer GM to the metalized active layer ACT of the driving thin-film transistor Tdr and then is delivered to the drain electrode D/E through the metalized active layer ACT.

Figure 3:
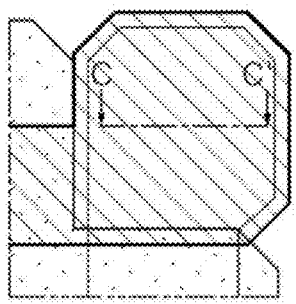
FIG. 3 is a diagram showing a cross section of a contact-hole portion C-C' of a branch line in an organic light-emitting display device according to an embodiment of the present disclosure.
Figure 3:
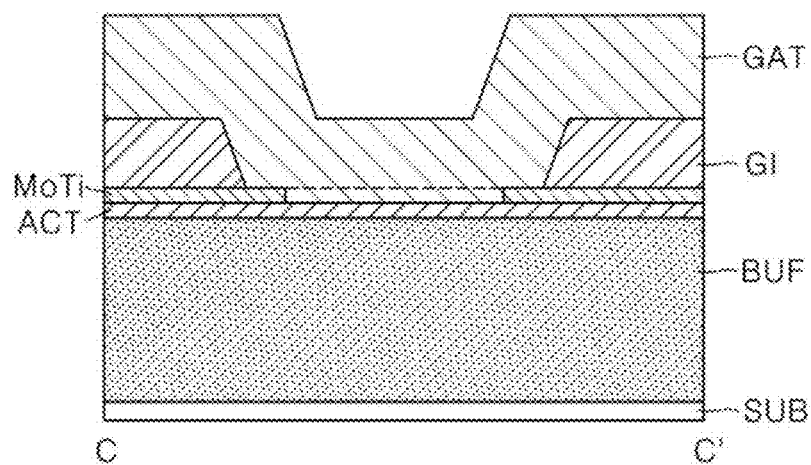
Figure 3:
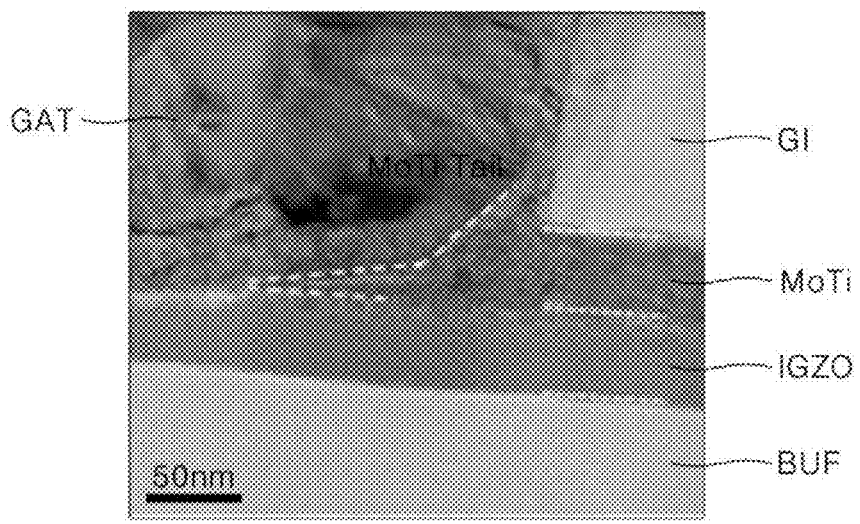

FIG. 3 is a diagram showing a cross section of a contact-hole portion C-C' of a branch line in an organic light-emitting display device according to an embodiment of the present disclosure. Particularly, (a) of FIG. 3 shows an enlarged view of an area including the C-C' portion of FIG. 1, while (b) and (c) of FIG. 3 show a cross-sectional view of the C-C' portion.

Referring to FIG. 3 including (a)-(c), in the cross section of the contact-hole portion C-C' of the branch line BL according to an embodiment of the present disclosure, the active layer ACT is disposed on the buffer layer BUF, and the gate metal layer GM and the molybdenum-titanium layer MoTi are disposed on the active layer.

For example, while the active layer ACT is disposed on the buffer layer BUF, the molybdenum-titanium layer MoTi is disposed on the active layer, and the gate insulating layer GI is disposed on the molybdenum-titanium layer, these three layers ACT, MoTi, and Gi are etched to form the contact-hole CNT. The gate metal layer GM can fill the contact-hole CNT.

Thus, in the contact-hole area CNT, a middle portion of the active layer ACT contacts the gate metal layer GM. In both side areas around the contact-hole CNT, the active layer ACT contacts the molybdenum-titanium layer MoTi.

Therefore, as the gate metal layer GM and the molybdenum-titanium layer MoTi are in electrical contact with each other in the contact-hole CNT, the power can be transferred to the driving thin-film transistor Tdr through the gate metal layer GM extending from the power line VDD/Ref and the molybdenum-titanium layer MoTi contacting the gate metal layer.

Figure 4:
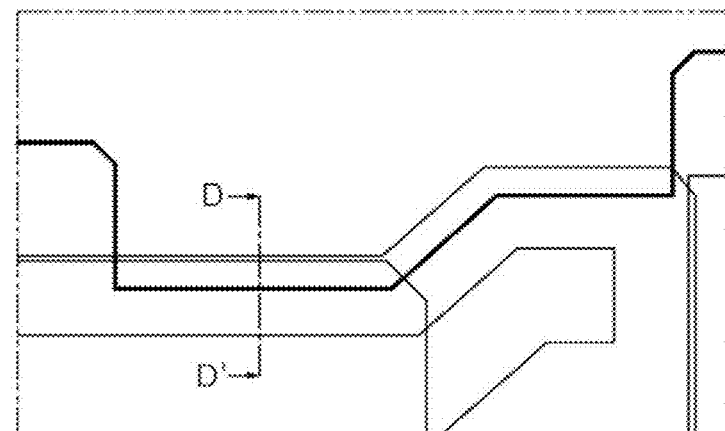
FIG. 4 is a diagram showing a cross section of a middle point D-D' of the branch line in an organic light-emitting display device according to an embodiment of the present disclosure.
Figure 4:
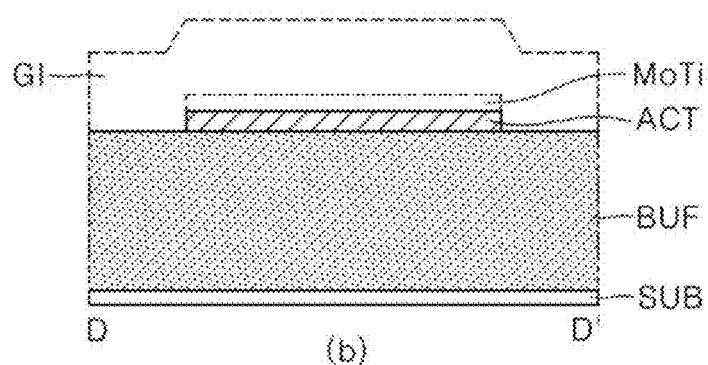
Figure 4:
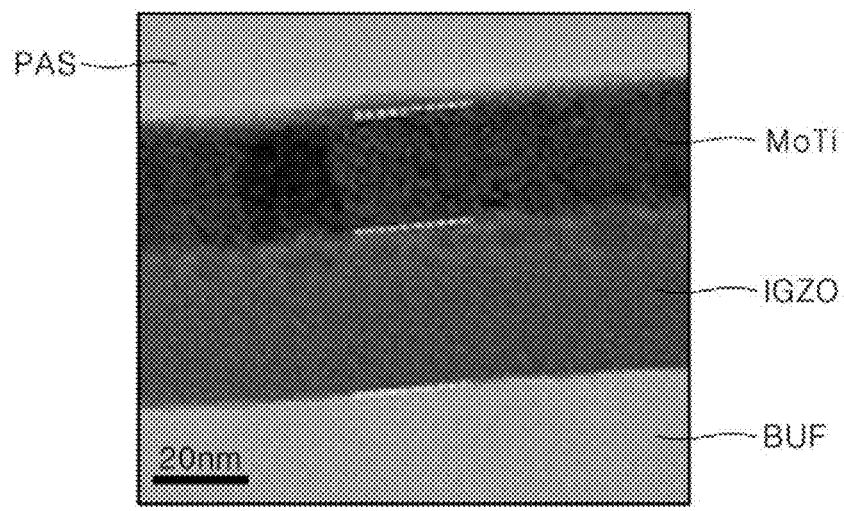

FIG. 4 is a diagram showing a cross section of a middle point D-D' of the branch line in the organic light-emitting display device according to an embodiment of the present disclosure. Particularly, (a) of FIG. 4 shows an enlarged view of an area including the D-D' portion of FIG. 1, while (b) and (c) of FIG. 4 show a cross-sectional view of the D-D' portion.

Referring to FIG. 4 including (a)-(c), the branch line BL according to an embodiment of the present disclosure is branched from the power line VDD/Ref and extends not only to one pixel P but also to another pixel to supply the power thereto.

In this connection, in the cross section of the middle point D-D' of the branch line BL, the active layer ACT is disposed on the buffer layer BUF, the molybdenum-titanium layer MoTi is disposed on the active layer, and the gate insulating layer GI is disposed on the molybdenum-titanium layer.

Further, a passivation layer PAS can be disposed on the molybdenum-titanium layer MoTi.

A width of the branch line BL can range from 330 to 340 angstroms (Å), preferably 330 angstroms (Å).

A vertical dimension of the branch line BL can have a range of 170 to 250 angstrom Å, preferably 220 angstrom Å.

FIG. 5 is a diagram showing a cross-sectional structure of a portion of a branch line connected to a driving thin-film transistor according to an embodiment of the present disclosure.

Referring to FIG. 5, the branch line BL according to an embodiment of the present disclosure is constructed so that the light-blocking layer LS is disposed on the substrate SUB to expose a portion of the substrate.

Accordingly, the buffer layer BUF is formed on the exposed portion of the substrate and the light-blocking layer. For example, the buffer layer BUF is positioned to cover both opposing side edges of the substrate SUB and the light-blocking layer LS.

Therefore, a portion of the buffer layer BUF overlapping the light-blocking layer protrudes upwards, while a non-protruding portion thereof is coplanar with the light-blocking layer. The buffer layer BUF is bent at a position between the protruding portion to the non-protruding portion.

The active layer ACT is formed on the buffer layer BUF. The active layer ACT can be formed on the protruding portion of the buffer layer and in a divided manner. Thus, the active layer ACT has left and right divided and spaced portions.

The molybdenum-titanium layer MoTi can be formed on the active layer. the molybdenum-titanium layer MoTi can be formed on each of the left and right divided and spaced portions of the active layer.

FIG. 6 is a diagram showing a structure of a portion of a branch line connected to a driving thin-film transistor according to an embodiment of the present disclosure.

Referring to FIG. 6, in the branch line BL according to an embodiment of the present disclosure, the dual line composed of the active layer ACT and the molybdenum-titanium layer MoTi is connected to the driving thin-film transistor Tdr. In this connection, the active layer ACT acts as a non-conductor, and the molybdenum-titanium layer MoTi acts as a conductor.

In this connection, the molybdenum-titanium layer MoTi constituting the dual line does not come into contact with the driving thin-film transistor Tdr and can be spaced therefrom by a predefined spacing.

However, the active layer ACT constituting the dual line extends while being in contact with a metalized first active layer BACT (Buffer Active Layer) of the driving thin-film transistor Tdr.

An inner end of the molybdenum-titanium layer MoTi overlaps and is in contact with the metalized first active layer BACT, at a contact point between the active layer ACT of the branch line BL and the metalized first active layer BACT of the driving thin-film transistor Tdr.

Therefore, the power from the power line VDD/Ref is transferred to the molybdenum-titanium layer MoTi via the gate metal layer GM of the contact-hole CNT, and then from the molybdenum-titanium layer MoTi to the metalized first active layer BACT of the driving thin-film transistor Tdr.

In a portion of the branch line BL connected to the driving thin-film transistor Tdr, the buffer layer BUF is disposed on the light-blocking layer LS, and the active layer ACT and the metalized first active layer BACT are disposed on the buffer layer. The molybdenum-titanium layer MoTi is disposed on the active layer, while the gate insulating layer GI of the driving thin-film transistor Tdr is disposed on the metalized first active layer. In the driving thin-film transistor Tdr, the gate metal layer GM or gate electrode GE is disposed on the gate insulating layer.

When connecting the branch line BL and the driving thin-film transistor Tdr to each other, a second contact-hole needs to be formed adjacent to the driving thin-film transistor Tdr in the prior art. However, according to the present disclosure, the molybdenum-titanium layer MoTi of the branch line BL contacts and is connected to the metalized first active layer BACT of the driving thin-film transistor Tdr, the second contact-hole is not required.

Therefore, when connecting the power line VDD/Ref and the driving thin-film transistor Tdr to each other through the branch line BL according to an embodiment of the present disclosure, an effect of reducing eighth contact-holes per pixel P can be obtained.

Figure 7:
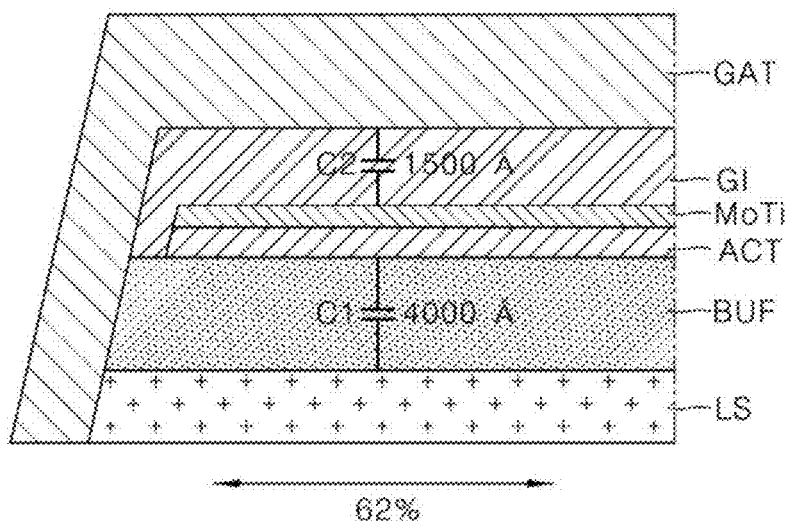
FIG. 7 is a diagram showing a capacitor structure in a branch line according to an embodiment of the present disclosure.

FIG. 7 is a diagram showing a capacitor structure in a branch line according to an embodiment of the present disclosure.

Referring to FIG. 7, in the branch line BL according to an embodiment of the present disclosure, the buffer layer BUF is disposed on the light-blocking layer LS, and the active layer ACT is disposed on the buffer layer. The molybdenum-titanium layer MoTi is disposed on the active layer, the gate insulating layer GI is disposed on the molybdenum-titanium layer, and the gate metal layer GAT is disposed on the gate insulating layer.

In this connection, the light-blocking layer LS can be made of a metal material having a light-blocking function in order to block inflow of external light as described above. For example, the light-blocking layer LS can be made of one of metals such as molybdenum (Mo), aluminum (Al), chromium (Cr), tungsten (W), titanium (Ti), nickel (Ni), neodymium (Nd), and copper (Cu), or an alloy thereof.

Therefore, since the light-blocking layer LS can act as one electrode of the capacitor, the light-blocking layer LS and the molybdenum-titanium layer MoTi can constitute a first capacitor C1 while the buffer layer BUF and the active layer ACT are interposed therebetween. In this connection, a thickness of the buffer layer BUF as an insulator in the first capacitor C1 can be 4000 angstroms (Å).

Since the molybdenum-titanium MoTi refers to an alloy of molybdenum (Mo) and titanium (Ti), the molybdenum-titanium layer MoTi can act as the opposite electrode of the first capacitor C1.

Further, the molybdenum-titanium layer MoTi and the gate metal layer GAT made of a metal material can constitute the second capacitor C2. In this connection, a thickness of the gate insulating layer GI as an insulator in the second capacitor C2 can be 1500 angstroms (Å).

It can be identified that the thickness of the gate insulating layer GI has been significantly reduced from 23500 angstroms (Å) (conventional example) to 1500 angstroms (Å) (present example).

Further, it can be identified that when applying the structure of the branch line BL according to the present disclosure, a size of the storage capacitor has also been reduced to 62% of a size of a conventional example.

Figure 8:
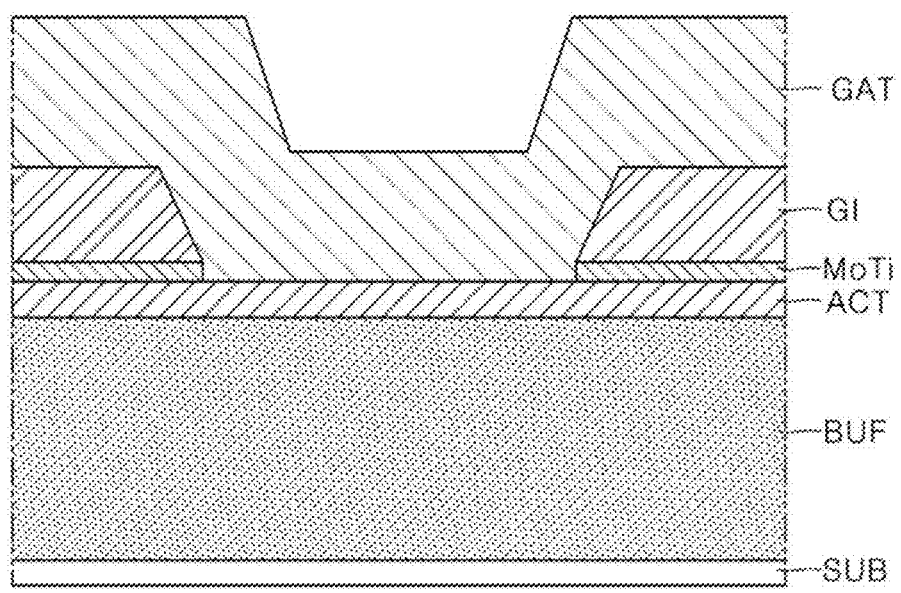
FIG. 8 is a diagram showing a structure of a branch line in a contact-hole portion near a power line according to an embodiment of the present disclosure.
Figure 9:
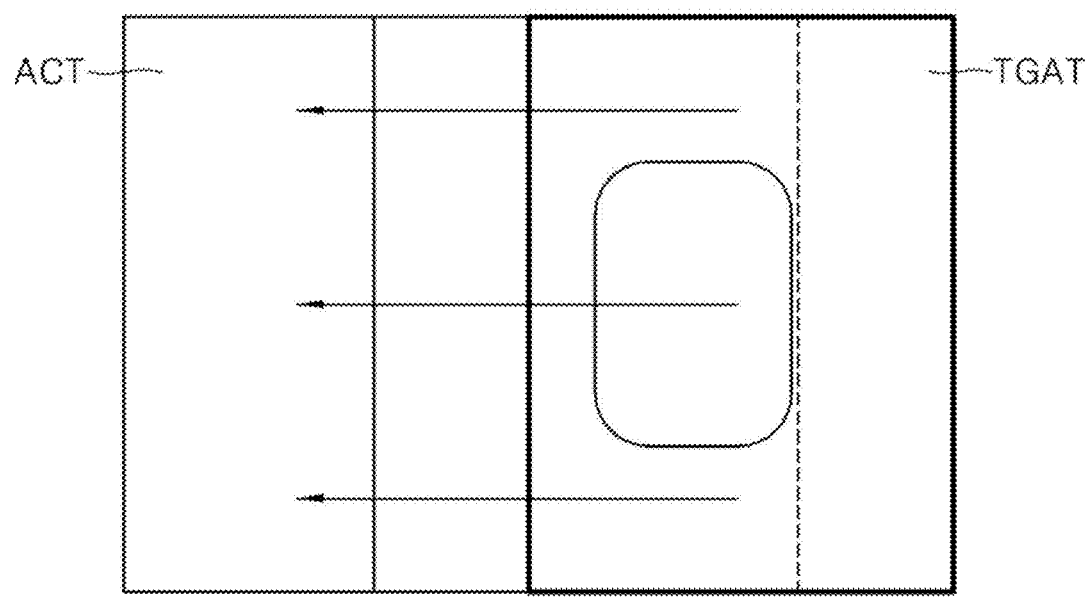
FIG. 9 is a diagram showing that a full contact area increases due to a branch line according to an embodiment of the present disclosure.

FIG. 8 is a diagram showing a structure of a branch line in a contact-hole portion near a power line according to an embodiment of the present disclosure. FIG. 9 is a diagram showing that a full contact area increases due to a branch line according to an embodiment of the present disclosure.

Referring to FIG. 8 and FIG. 9, it can be identified that in the branch line BL according to an embodiment of the present disclosure, the molybdenum-titanium layer MoTi contacts the gate metal layer GAT in the contact-hole area CNT, as described above.

In the contact-hole area CNT of the branch line BL, the active layer ACT is disposed on the buffer layer BUF, and the molybdenum-titanium layer MoTi and the gate metal layer GAT are disposed on the active layer ACT.

Therefore, as the gate metal layer GAT contacts the molybdenum-titanium layer MoTi, the power from the power line VDD/Ref is transferred from the contact-hole CNT to the molybdenum-titanium layer MoTi through the gate metal layer GAT.

In a conventional example, in the contact-hole area CNT, the active layer ACT acts as a conductor. However, when the active layer ACT is deviated from the contact-hole CNT, the active layer acts as a semiconductor, such that a full contact is not realized. However, according to the present disclosure, as the molybdenum-titanium layer MoTi contacts the gate metal layer in the contact-hole area CNT, the full contact can be realized. Thus, it can be identified that according to the structure of the contact-hole CNT, a size of the contact-hole CNT has been reduced, and accordingly, the full contact area has been reduced as shown in FIG. 9. It can be identified that in the contact-hole area CNT, a conventional full contact area is 4.1 μm×7.5 μm, whereas the full contact area is reduced to 4.1 μm×4.1 μm due to the contact-hole CNT according to an embodiment of the present disclosure.

Figure 10:
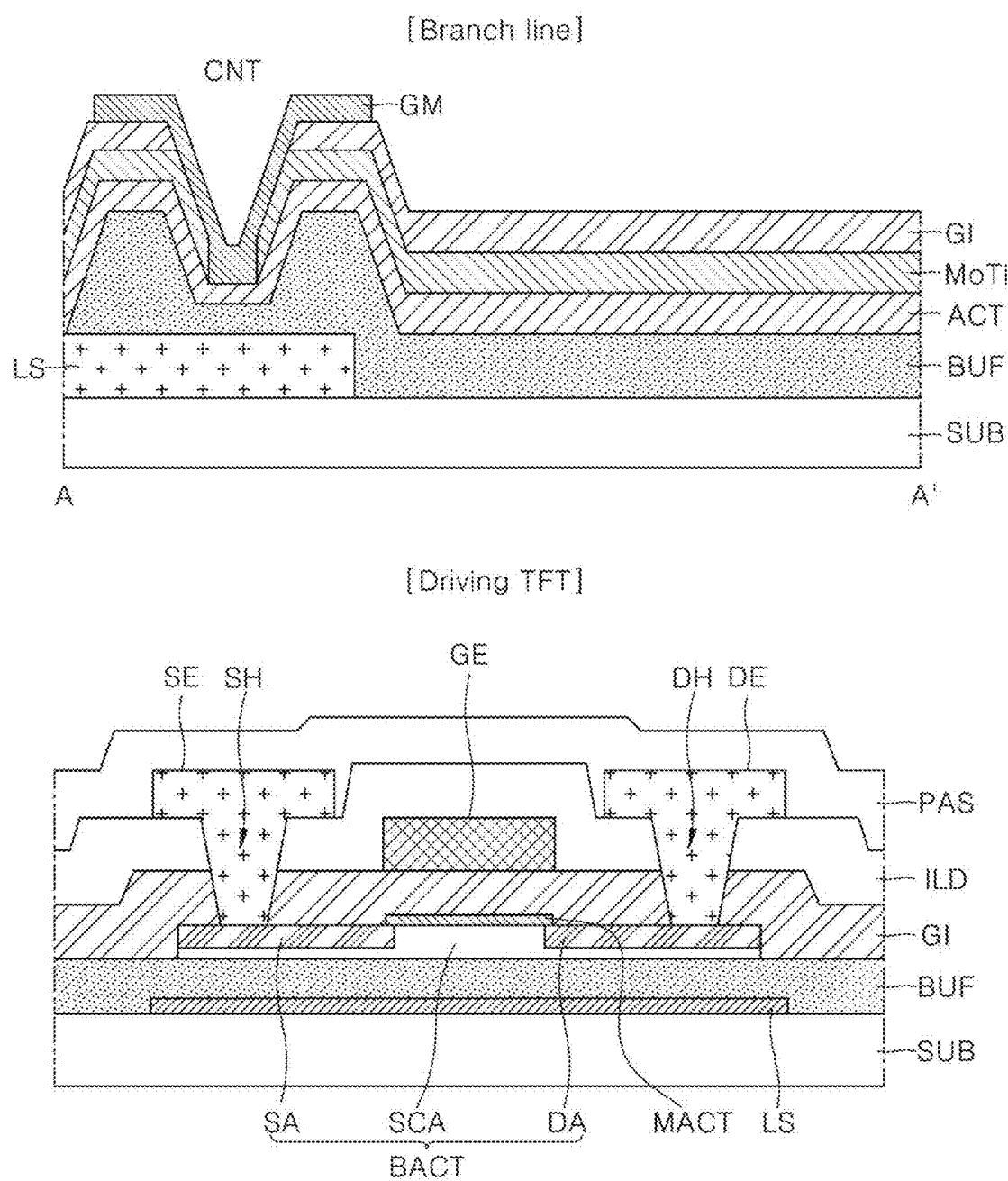
FIG. 10 is a diagram showing a cross-sectional view of a branch line according to an embodiment of the present disclosure and a cross-sectional view of a driving thin-film transistor connected to the branch line.

FIG. 10 is a diagram showing a cross-sectional view of a branch line (top figure) according to an embodiment of the present disclosure and a cross-sectional view of a driving thin-film transistor (bottom figure) connected to the branch line.

Referring to FIG. 10, as described above, in a branch line BL according to an embodiment of the present disclosure, the light-blocking layer LS is disposed on the substrate SUB, the buffer layer BF is disposed on the light-blocking layer, the active layer ACT is disposed on the buffer layer, the molybdenum-titanium layer MoTi is disposed on the active layer, and the gate insulating layer GI is disposed on the molybdenum-titanium layer.

The contact-hole CNT is formed in a portion of the molybdenum-titanium layer and a portion of the gate insulating layer overlapping the light-blocking layer. The gate metal layer GM overlapping the active layer, the molybdenum-titanium layer and the gate insulating layer is disposed in the contact-hole area CNT.

The active layer and the molybdenum-titanium layer extend from the contact-hole CNT to the channel BACT of the driving thin-film transistor Tdr.

The driving thin-film transistor Tdr can include the first active layer BACT and a second active layer (main active layer) MACT stacked on the substrate SUB, the gate insulating layer GI disposed over the substrate SUB to cover the first active layer BACT and the second active layer MACT, the gate electrode GE on the gate insulating layer GI, an interlayer insulating layer ILD disposed on the gate insulating layer GI to cover the gate electrode GE, a source electrode SE and a drain electrode DE connected to an source area SA and a drain area DA of the first active layer BACT respectively via a source contact-hole SH and a drain contact-hole DH passing through the interlayer insulating layer ILD and the gate insulating layer GI, and a passivation layer PAS disposed on the interlayer insulating layer ILD to cover the source electrode SE and the drain electrode DE In an embodiment of the present disclosure, an example in which the driving thin-film transistor Tdr is connected to the branch line BL is described. However, the present disclosure is not limited thereto. The same principle can be equally applied to a case when a sensing thin-film transistor Tss or a switching thin-film transistor Tsw is connected to the branch line.

Further, the driving thin-film transistor Tdr can additionally include a light-blocking layer LS and the buffer layer BUF stacked between the substrate SUB and the first active layer BACT.

The light-blocking layer LS on the substrate SUB is made of a metal material having a light-blocking function to block the inflow of external light into the first active layer BACT and the second active layer MACT. The light-blocking layer LS can be composed of a single layer or a multilayer structure made of one of metals such as molybdenum (Mo), aluminum (Al), chromium (Cr), tungsten (W), titanium (Ti), nickel (Ni), neodymium (Nd) and copper (Cu), or an alloy thereof.

The buffer layer BUF disposed on the substrate SUB to cover the light-blocking layer LS can be formed as a single insulating layer or as a structure in which a plurality of insulating layers are stacked in order to block foreign materials including moisture, oxygen, etc. flowing from the substrate SUB. The buffer layer BUF can be made of an inorganic insulating material such as silicon oxide $SiO_x$, silicon nitride $SiN_x$, aluminum oxide $AlO_x$, etc. or can be composed of a single layer or a multilayer structure. The gate insulating layer GI can be made of an oxide-based insulating material to prevent changes in properties of the active layer BACT and MACT made of the oxide semiconductor.

The first active layer BACT and the second active layer MACT stacked on the buffer layer BUF can be made of different oxide semiconductors having different mobility characteristics. The second active layer MACT can have higher mobility and can be thinner than the first active layer BACT, and thus can serve as a main channel. The first active layer BACT can have lower mobility and can be thicker than the second active layer MACT, and can have a metalized source area SA and a metalized drain area DA as metalized to reduce an offset resistance and the remaining semiconductor area SCA.

The second active layer MACT can be made of an oxide semiconductor material having a carrier concentration higher than or equal to a reference value in order to realize higher mobility characteristics above the reference value. For example, the second active layer MACT can be made of an oxide semiconductor material having a high carrier concentration of $10^{20}/cm^3$ or greater in order to implement high mobility characteristics of 50 $cm^2/Vs$ or greater. The second active layer MACT can have high mobility characteristics 100 $cm^2/Vs$ at a high carrier concentration of $10^{20}/cm^3$ in order to maintain semiconductor characteristics. Materials having the higher carrier concentration than the reference value can include a transparent conductive oxide (TCO). The TCO can include at least one of ITO (Indium Tin Oxide), IZO (Indium Zinc Oxide), and ATO (Antimony Tin Oxide). For example, the second active layer MACT can be made of an oxide semiconductor based on IZO (indium zinc oxide) or IGZO (indium gallium zinc oxide).

The second active layer MACT can be formed to have a high mobility characteristic of a reference value (50 $cm^2/Vs$) or greater, and to have a thickness smaller than a maximum value that maintains the characteristics of the semiconductor whose switching is controlled by the gate voltage. For example, the second active layer MACT which has a high mobility characteristic of the reference value (50 $cm^2/Vs$) or greater can be formed to have a thickness greater than 0 nm and smaller than or equal to 10 nm. This is because when the second active layer MACT having the high mobility characteristic has a thickness larger than the above-described maximum, a channel is opened irrespective of the gate voltage, and thus the semiconductor characteristic switched by the gate voltage can be lost.

In one example, when a metalized source area and a metallized drain area are formed at the second active layer MACT having a thickness smaller than the aforementioned maximum, the offset resistance of the source area and the drain area increases due to the thinness of the second active layer MACT such that the current based on the same voltage decreases, and thus the power consumption of the oxide TFT can be increased.

To prevent this situation, the driving thin-film transistor Tdr according to the present disclosure has the first active layer BACT which has lower mobility and thicker than the second active layer MACT. The first active layer BACT can have a metalized source area SA and a drain area DA to reduce the offset resistance thereof. For example, the first active layer BACT can be made of an oxide semiconductor having a carrier concentration lower than $10^{18}/cm^3$ so as to have a mobility of 30 $cm^2/Vs$ or lower. The first active layer BACT has a carrier concentration of $10^{16}/cm^3$ or greater so as to have a mobility of 10 $cm^2/Vs$ or greater in order to maintain the oxide semiconductor characteristics. The first active layer BACT can have a thickness greater than 10 nm and smaller than or equal to 40 nm so that the offset resistance of the source area SA and the drain area DA is lower than a threshold.

The first active layer BACT can be made of an oxide semiconductor including at least one metal among In, Ga, Zn, Al, Sn, Zr, Hf, Cd, Ni, and Cu. The first active layer BACT can be made of an oxide semiconductor having a higher etching selectivity relative to that of the second active layer MACT so that the first active layer BACT is less affected by the etching of the second active layer MACT, for example, an etching rate thereof is lower. For example, the first active layer BACT can be made of an oxide semiconductor based on Sn, and specifically can be made of one of ZnSnO, InSnZnO, InGaSnO, and ZnSiSnO.

The first active layer BACT can have the source area SA and the drain area DA having low resistance due to the metallization thereof, and the remaining semiconductor area SCA between the source area SA and the drain area DA. The source area SA and the drain area DA of the first active layer BACT serve to lower the offset resistance between the first active layer BACT and the source electrode SE and drain electrode DE. The source area SA and the drain area DA are metalized areas formed by exposing the first active layer BACT to plasma, ultraviolet UV or etchant to partially remove oxygen therefrom. The source area SA and the drain area DA can be spaced from each other.

The second active layer MACT formed on the first active layer BACT overlaps and contacts the semiconductor area SCA between the source area SA and the drain area DA of the first active layer BACT, and overlaps and contacts a portion of each of the source area SA and the drain area DA. In this way, the channel between the source area SA and the drain area DA is formed.

The gate insulating layer GI covering a stacked structure of the first active layer BACT and the second active layer MACT is formed over the buffer layer BUF. The gate insulating layer GI is formed on the second active layer MACT. The gate insulating layer GI can be made of an inorganic insulating material such as silicon oxide $SiO_x$, silicon nitride $SiN_x$, aluminum oxide $AlO_x$, etc. and can be composed of a single layer or a multilayer structure. The gate insulating layer GI can be made of an oxide-based insulating material to prevent changes in properties of the active layers BACT and MACT made of the oxide semiconductor.

The gate electrode GE overlapping the second active layer MACT is formed on the gate insulating layer GI. The gate electrode GE can be formed in a single-layer or a multi-layer structure made of one of metals such as molybdenum (Mo), aluminum (Al), chromium (Cr), tungsten (W), titanium (Ti), nickel (Ni), neodymium (Nd), and copper (Cu), or an alloy thereof.

On the gate insulating layer GI, the interlayer insulating layer ILD covering the gate electrode GE is formed. A source contact-hole SH and a drain contact-hole DH extending through the interlayer insulating layer ILD and the gate insulating layer GI are formed. The interlayer insulating layer ILD can be made of an inorganic insulating material such as silicon oxide $SiO_x$, silicon nitride $SiN_x$, aluminum oxide $AlO_x$, or the like and can be formed as a single layer or a multilayer structure, or can be made of an organic insulating material.

The source electrode SE and the drain electrode DE are formed on the interlayer insulating layer ILD. The source electrode SE is connected to the source area SA of the first active layer BACT via the source contact-hole SH, while the drain electrode DE is connected to the drain area DA of the first active layer BACT via the drain contact-hole DH. Each of the source electrode SE and the drain electrode DE is composed of a single layer or a multilayer structure made of one of metals such as molybdenum (Mo), aluminum (Al), chromium (Cr), tungsten (W), titanium (Ti), nickel (Ni), neodymium (Nd) or copper (Cu), or an alloy thereof.

The passivation layer PAS covering the source electrode SE and the drain electrode DE is formed on the interlayer insulating layer ILD. The interlayer insulating layer ILD can be made of an inorganic insulating material such as silicon oxide $SiO_x$, silicon nitride $SiN_x$, aluminum oxide $AlO_x$, etc. and can be composed of a single layer or a multilayer structure.

In the driving thin-film transistor Tdr having the structure as described above, the metalized first active layer BACT is connected to the molybdenum-titanium layer MoTi of the branch line BL. Thus, the power from the power line VDD/Ref is conducted from the contact-hole CNT to the molybdenum-titanium layer MoTi through the gate metal layer GM, and thus from the molybdenum-titanium layer MoTi to the drain electrode DE through the metalized first active layer BACT.

Figure 11:
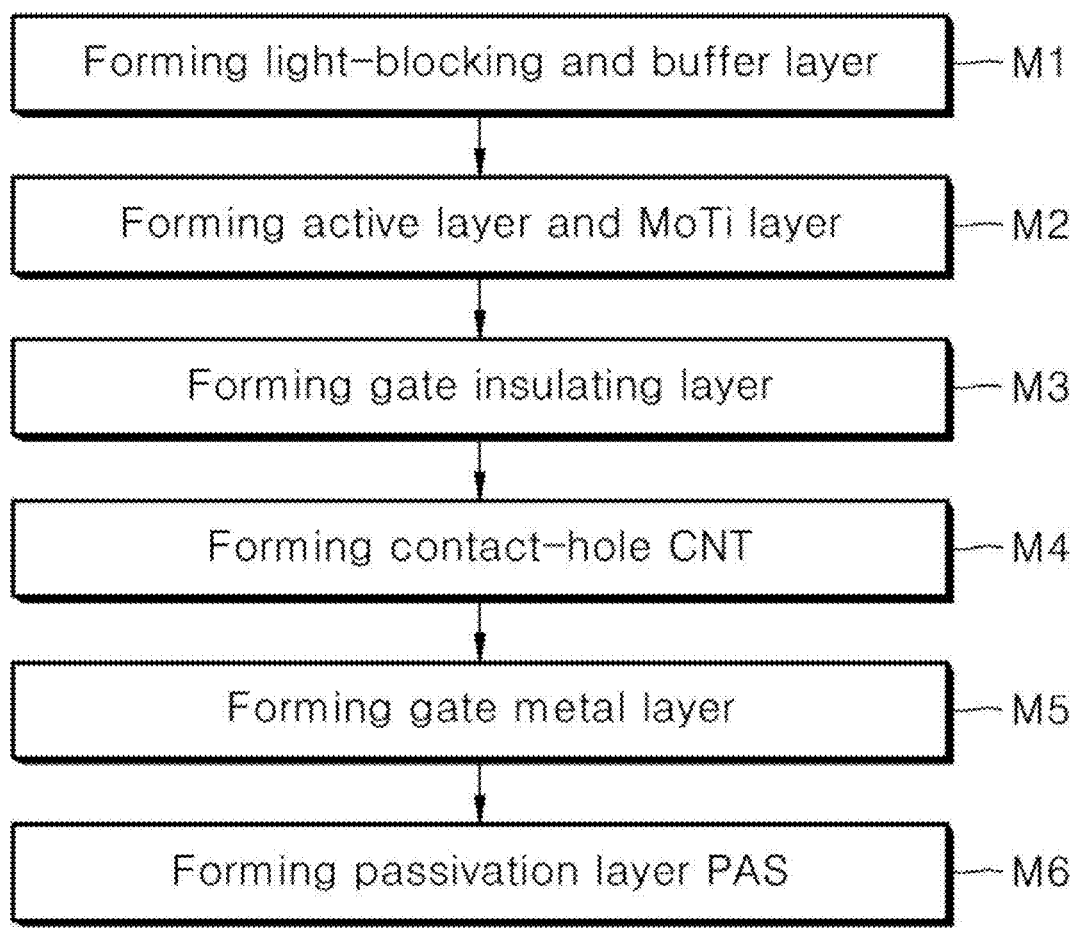
FIG. 11 is a flowchart sequentially showing a process of manufacturing a branch line in a manufacturing method of an organic light-emitting display device according to an embodiment of the present disclosure.

FIG. 11 is a flowchart sequentially showing a process of manufacturing a branch line in an organic light-emitting display device manufacturing method according to an embodiment of the present disclosure. FIGS. 12 to 17 are cross-sectional views sequentially showing a manufacturing process of a branch line according to an embodiment of the present disclosure.

Hereinafter, the manufacturing process of the branch line according to an embodiment of the present disclosure will be described with reference to FIGS. 11 to 17.

Figure 12:
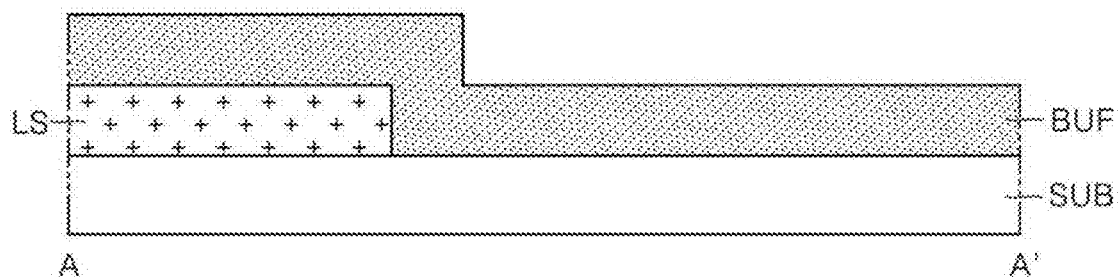
Figure 13:
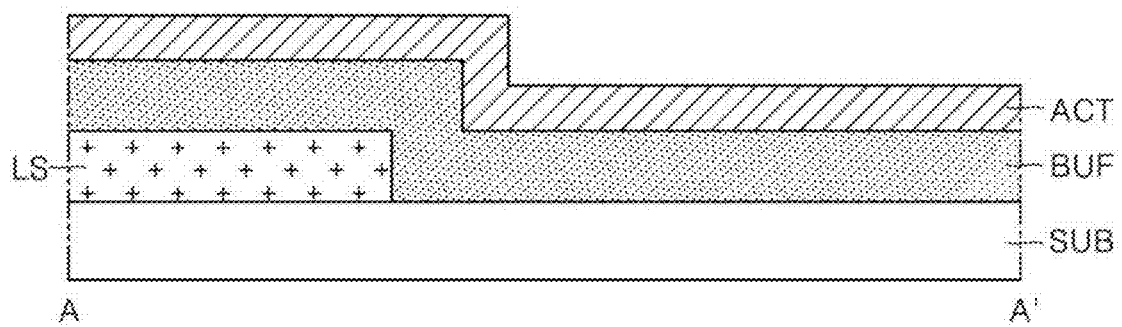
Figure 14:
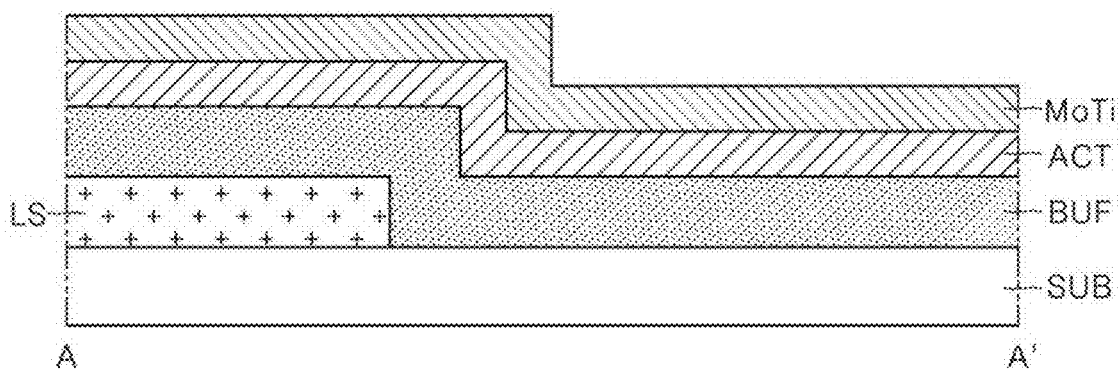

Referring to FIGS. 11 and 12, the light-blocking layer LS is formed on the substrate SUB using a first mask process M1, and the buffer layer BUF covering the light-blocking layer LS is formed thereon.

For example, the light-blocking layer LS is formed on a top face of the substrate SUB so that the portion of the substrate is exposed. Then, the buffer layer BUF is formed on the exposed top face of the substrate and a top face of the light-blocking layer. Therefore, the buffer layer BUF is formed to cover an entirety of the light-blocking layer LS while being bent at a portion thereof covering the light-blocking layer LS.

In more detail, the light-blocking metal layer LS is deposited on an entire face of the substrate SUB, and then the light-blocking metal layer is patterned using a photolithography process using a first mask and an etching process. Thus, the light-blocking layer LS is formed on a portion of the substrate SUB that needs to be protected from light. Then, the buffer layer BUF covering the light-blocking layer LS is formed on the substrate SUB.

Next, referring to FIGS. 11 to 14, the active layer ACT is formed on the buffer layer BUF using a second mask process M2, and the molybdenum-titanium layer MoTi is formed on the active layer.

In this connection, a halftone mask or a diffraction slit mask can be used as the second mask. A photoresist pattern having first and second vertical dimensions is formed on the buffer layer BUF by a photolithography process using a second mask. In a portion where only the active layer ACT is to be formed, a first photoresist area having the first vertical dimension corresponding to a halftone portion or a diffraction portion of the second mask is formed. In a portion where the molybdenum-titanium layer MoTi is to be formed, a second photoresist area having the second vertical dimension (larger than the first vertical dimension) corresponding to a light-shielding portion of the second mask is formed. In a portion where both the active layer and the molybdenum-titanium layer are to be removed, no photoresist is formed in a corresponding manner to a light transmitting portion of the second mask. The molybdenum-titanium layer and the underlying active layer are patterned by an etching process using the photoresist pattern as a mask, so that the active layer ACT and the upperlying molybdenum-titanium layer have the same pattern. The active layer and the molybdenum-titanium layer can be etched simultaneously by a wet etching process using OZ acid.

Next, referring to FIGS. 11 and 15, the gate insulating layer GI is formed on the molybdenum-titanium layer MoTi using a third mask process M3.

In this connection, the gate insulating layer GI is not patterned. Thus, the foreign material does not occur due to the etching of the gate insulating layer GI. In a subsequent process, process defects such as short circuit defects between electrodes due to the foreign material can be suppressed.

Next, referring to FIGS. 11 and 16, a contact-hole CNT extending through the molybdenum-titanium layer MoTi and the gate insulating layer GI is formed using a fourth mask process M4.

Next, referring to FIG. 11 and FIG. 17, the gate metal layer GM is formed on a top face of the active layer, a top face of the molybdenum-titanium layer, and a top face of the gate insulating layer using a fifth mask process M5.

For example, in the contact-hole area CNT, the molybdenum-titanium layer MoTi and the gate metal layer GM are in contact with each other. The gate metal layer GM is in contact with both side walls and a bottom of the molybdenum-titanium layer MoTi corresponding to both side walls of a bottom of the active layer ACT in the contact-hole area CNT.

Subsequently, the passivation layer PAS covering the gate metal layer GM and the gate insulating layer GI is formed using a sixth mask process M6.

Using the manufacturing process as described above, the branch line BL can be constructed such that the gate metal layer GM contacts the molybdenum-titanium layer MoTi in the contact-hole area CNT, and a dual line, for example, the active layer and the molybdenum-titanium layer can extend the contact-hole CNT to the channel BACT of the drive thin-film transistor Tdr.

Therefore, the power from the power line VDD/Ref is conducted from the contact-hole CNT to the molybdenum-titanium layer MoTi through the gate metal layer GM. As the power is conducted to the channel BACT of the driving thin-film transistor Tdr through the molybdenum-titanium layer MoTi, the power is supplied from the power line VDD/Ref to the driving thin-film transistor Tdr.

As described above, according to the present disclosure, the organic light-emitting (OLED) display device is capable of reducing the number of the contact holes and thus improving the aperture ratio in a structure in which the power line VDD/Ref is branched and the power is supplied through the branched line to the thin-film transistor Tdr. Further, the method for manufacturing the same can be provided.

For example, in the organic light-emitting OLED display device according to the present disclosure, in the branch line BL that connects the power line VDD/Ref and the driving thin-film transistor Tdr to each other, the contact-hole CNT is not formed adjacent to the driving thin-film transistor Tdr, while the contact-hole CNT is formed only adjacent to the power line VDD/Ref, such that the number of contact-holes CNTs per pixel can be reduced.

Further, according to the present disclosure, when manufacturing the branch line BL connecting the power line VDD/Ref and the driving thin-film transistor Tdr to each other, the gate metal layer GM connected to the power line VDD/Ref is in contact with the molybdenum-titanium layer MoTi in the contact-hole area CNT. The active layer ACT and the molybdenum-titanium layer MoTi as the dual-line extend from the contact-hole CNT to the driving thin-film transistor Tdr. Thus, the power from the power line VDD/Ref is supplied to the channel of the driving thin-film transistor Tdr through the molybdenum-titanium layer MoTi in contact with the gate metal layer GM in the contact-hole area CNT.

Although the embodiments of the present disclosure have been described in more detail with reference to the accompanying drawings, the present disclosure is not necessarily limited to these embodiments. The present disclosure can be implemented in various modified manners within the scope not departing from the technical idea of the present disclosure. Accordingly, the embodiments disclosed in the present disclosure are not intended to limit the technical idea of the present disclosure, but to describe the present disclosure. The scope of the technical idea of the present disclosure is not limited by the embodiments. Therefore, it should be understood that the embodiments as described above are illustrative and non-limiting in all respects. The scope of protection of the present disclosure should be interpreted by the claims, and all technical ideas within the scope of the present disclosure should be interpreted as being included in the scope of the present disclosure.

What is claimed is:

1. An organic light-emitting display device comprising:
    a light-blocking layer disposed on a substrate;
    a buffer layer disposed on the light-blocking layer;
    an active layer disposed on the buffer layer;
    a first metal layer disposed on the active layer; and
    a gate insulating layer disposed on the first metal layer,
        wherein a contact-hole is formed in the first metal layer and the gate insulating layer and in an area of overlapping with the light-blocking layer, and
        wherein the active layer and the first metal layer extend from the contact-hole to a channel of a thin-film transistor.

2. The organic light-emitting display device of claim 1, wherein the organic light-emitting device further comprises a power line configured to supply power to the thin-film transistor, and
    wherein the active layer and the first metal layer form a branch line for connecting the power line to the thin-film transistor.

3. The organic light-emitting display device of claim 2, wherein the organic light-emitting display device further comprises a gate metal layer disposed on the active layer, the first metal layer, and the gate insulating layer so as to contact the active layer and the first metal layer in the contact hole area.

4. The organic light-emitting display device of claim 3, wherein a stack of the gate metal layer, the interlayer insulating layer, and the first metal layer forms a second capacitor.

5. The organic light-emitting display device of claim 4, wherein the interlayer insulating layer has a thickness of approximately 1500 angstroms (Å).

6. The organic light-emitting display device of claim 1, wherein the first metal layer includes molybdenum-titanium (MoTi) as an alloy of molybdenum and titanium.

7. The organic light-emitting display device of claim 1, wherein the active layer and the first metal layer extend from the contact-hole and are connected to a channel including a metalized first active layer of the thin-film transistor.

8. The organic light-emitting display device of claim 1, wherein a passivation film is disposed on a portion of the active layer and the first metal layer extending from the contact-hole to the thin-film transistor.

9. The organic light-emitting display device of claim 1, wherein a stack of the light-blocking layer, the buffer layer, and the active layer forms a first capacitor.

10. The organic light-emitting display device of claim 9, wherein the buffer layer has a thickness of approximately 4000 angstroms (Å).

11. The organic light-emitting display device of claim 1, wherein the thin-film transistor includes:
    a base substrate;

a light-blocking layer disposed on the base substrate;
a buffer layer disposed on the light-blocking layer;
a first active layer disposed on the buffer layer;
a second active layer disposed on the first active layer so that a portion of the first active layer is exposed;
an interlayer insulating layer disposed on the first active layer and the second active layer;
a gate electrode disposed on the interlayer insulating layer to expose a portion of the interlayer insulating layer; and
a passivation layer disposed on the exposed portion of the interlayer insulating layer and a top face of the gate electrode,
wherein the first active layer extends from the thin-film transistor, and is connected to the active layer, and is in contact with the first metal layer disposed on the active layer.

12. The organic light-emitting display device of claim 11, wherein the first active layer is a metalized semiconductor layer, and the active layer is a non-conductor.

* * * * *